United States Patent [19]
Takashi et al.

[11] Patent Number: 5,659,309
[45] Date of Patent: Aug. 19, 1997

[54] DATA RECORDING/REPRODUCING APPARATUS HAVING VITERBI DECODER AND METHOD THEREOF

[75] Inventors: Terumi Takashi; Yasuhide Ouchi, both of Odawara; Seiichi Mita, Tsukui-gun; Akihiko Hirano; Naoki Satoh, both of Odawara, all of Japan

[73] Assignee: Hitachi, Ltd., Tokyo, Japan

[21] Appl. No.: 389,773

[22] Filed: Feb. 16, 1995

[30] Foreign Application Priority Data

Feb. 18, 1994 [JP] Japan ................... 6-021428

[51] Int. Cl.$^6$ .................................................. H03M 7/00
[52] U.S. Cl. .............................................................. 341/50
[58] Field of Search ..................... 341/50, 51; 395/2.51; 375/341, 262

[56] References Cited

U.S. PATENT DOCUMENTS 5,291,523  3/1994  Bergmans et al. ................. 375/14

Primary Examiner—Brian K. Young
Attorney, Agent, or Firm—Antonelli, Terry, Stout & Kraus, LLP

[57] ABSTRACT

A data recording/reproducing apparatus and method therefor having a Viterbi decoder which stores operation result values of an inputted reproduced signal and the reference value when the peak value of the reproduced signal is updated, compares this value with the reproduced signal in amplitude, updates the stored value when the result satisfies the predetermined condition, detects a change in the polarity of the comparison result, controls the clock counter depending on the status of the peak value updating signal, sets 1 in the shift register at the position indicated by the counter according to the detected polarity inversion signal when the peak value is updated, and accordingly makes the updating and detecting operations independent of operations of addition and subtraction of the current reproduced signal and reference value and operations of addition and subtraction of amplitude comparison.

14 Claims, 10 Drawing Sheets

FIG. 3

SELECTOR 4,5 : SELECTION SIGNAL

| RS-FF OUTPUT \ COMPARATOR OUTPUT 8, COMPARATOR OUTPUT 9 | 00 | 01 | 11 | 10 |
|---|---|---|---|---|
| 0 | x | 0 | x | 1 |
| 1 | x | 0 | x | 1 |

DETECTED POLARITY INVERSION SIGNAL C

| DFF16 OUTPUT \ COMPARATOR OUTPUT 8, COMPARATOR OUTPUT 9 | 00 | 01 | 11 | 10 |
|---|---|---|---|---|
| 0 | x | 0 | x | 1 |
| 1 | x | 0 | x | 1 |

X : ANY VALUE OF "0" OR "1" IS AVAILABLE

DATA RECORDING/REPRODUCING APPARATUS HAVING VITERBI DECODER AND METHOD THEREOF

BACKGROUND OF THE INVENTION

1. Field of the Invention

The present invention relates to a Viterbi decoding art and a data recording/reproducing apparatus and method thereof using it and more particularly to a Viterbi decoder and operation method which are used for signal reproducing in a magnetic storage and others and to a recording/reproducing apparatus and method thereof using it.

2. Description of the Prior Art

Recently, to realize a highly reliable signal reproducing circuit accompanying high density recording in a magnetic storage, a signal reproducing circuit by the Viterbi decoding system using the relationship of reproduced signals as described in "Viterbi Detection of Class IV Partial Response on a Magnetic Recording Channel" (IEEE Transactions on communications, VOL. COM-34, May 1986, p.p. 454–461), Roger W. Wood and others has been used. The Viterbi decoding system is a system for decoding data on the basis of the sampled data which is a sampled reproduced signal and operates the amplitude difference between the sampled data at the sampling time of 'n' and at the previous sampling time of 'n–p' and compares the amplitude difference and the reference value. When the amplitude difference is more than the reference value and the detected polarity is inverted, the decoding system sets 1 and in other cases, it sets 0. The constitution and operation of the conventional Viterbi decoder will be explained hereunder with reference to FIGS. 9 and 10. FIG. 9 is a block diagram of the conventional Viterbi decoder. Numeral 1 indicates a sampling circuit, 51 a storage circuit, 52 a subtracter, 53 a selector, 54 and 55 comparators, 56 and 57 exclusive OR circuits (abbreviated to EOR), 58 a flip-flop (abbreviated to DFF), 59 a counter which can count up to a numerical value of k, 60 an address storage circuit, 61 and 62 selectors, and 63 a random access memory (abbreviated to RAM) having k storage regions.

The sampling circuit 1 converts a reproduced signal obtained from a magnetic storage medium to sampled data X(n) whenever the sampling clock HCLK is triggered (hereinafter, the sampled data at the sampling time of'n'is expressed by X(n)). The Viterbi decoder compares the amplitude difference between the sampled data X(n) and X(n–p) and the reference value and decodes the data depending on the comparison result. The storage circuit 51 stores the sampled data X(n–p) at the sampling time of 'n–p' and the subtracter 52 subtracts X(n–p) from X(n) so as to obtain the amplitude difference. The comparators 54 and 55 compare the amplitude between the amplitude difference and reference value (±Vth or 0). The comparator 54 outputs 'High' when X(n)–X(n–p)>Vth or X(n)–X(n–p)>–Vth and the comparator 55 outputs 'High' when X(n)–X(n–p)>0. On the basis of this detected result, the EOR 56 makes the peak value updating signal P high under the following condition and updates various statuses. Condition 1: The output of the comparator 54 is 'High' and the output of the comparator 55 is 'Low', that is, Vth<X(n)–X(n–p) and X(n)–X(n–p)<0.

Condition 2: The output of the comparator 54 is 'Low' and the output of the comparator 55 is 'High', that is, –Vth>X(n)–X(n–p) and X(n)–X(n–p)>0.

The EOR 57 is a circuit for indicating that the direction of polarity to be detected is changed. When the output of the comparator 55 does not match the output of the DFF 58 which stores the polarity of X(n)–X(n–p), the output of the EOR 57 goes high. The counter 59 counts up from 0 to k sequentially whenever the sampling clock HCLK is triggered. When the count reaches k, the counter starts to count from 0 again. The address storage circuit 60 stores the numerical value of the counter 59 when the peak value updating signal P is changed from 'High' to 'Low'. The selector 61 generates an address of the RAM 63. When the peak value updating signal P is high, the selector 61 outputs the value of the address storage circuit 60 as an address of the RAM 63. When the peak value updating signal P is low, the selector 61 outputs the output of the counter 59 as an address of the RAM 63. The RAM 63 outputs the data of the specified address as decoded data and stores the data outputted from the selector 62. Therefore, when the peak value updating signal P is low, the data stored in the RAM 63 is outputted sequentially as decoded data according to an address generated by the counter 59. On the other hand, when the peak value updating signal P is high, the data of the RAM 63 at the address stored in the address storage circuit 60 is rewritten to the output value of the EOR 57 via the selector 62. When the decoded data is 1, the rewritten data is read from the RAM 63 without being rewritten again. When the decoded data is 0, it is rewritten again before being outputted as decoded data and 0 is stored.

For example, assuming that a reproduced signal as shown in FIG. 10 is inputted to the Viterbi decoder, the status of each circuit becomes as shown below. The reproduced signal is sampled at the leading edge of the sampling clock and converted to sampled data at the positions of ● shown in the drawing. The positions where the peak value updating signal P goes high are indicated by o shown in the drawing and a value indicated by X(n–p) is stored in the storage circuit 51. The amplitude difference operated by the subtracter 52 is indicated by the length of an arrow shown in the drawing. This amplitude difference is detected by the comparators 54 and 55 and the peak value updating time is decided by the EOR 56. When the peak value updating signal P is high, the numerical value of the RAM 63 at the address stored in the address storage circuit 60 is set to 1 when the polarity of the operation result X(n)–X(n–p) is changed. In other cases, it is set to 0. According to this operation, when the polarity of X(n)–X(n–p) is changed as shown at the sampling time of 0, 2, or 4, 1 is detected. When the polarity of operation result is not changed as shown at the sampling time of 5 or 6 even when the peak value updating is executed, 0 is detected. By repeating this operation, the decoded data becomes highly reliable data in which there are few discrimination errors.

As mentioned above, the conventional Viterbi decoder is constituted so as to operate X(n)–X(n–p), compare the result with the reference value, and discriminate the data according to the comparison result and provides a highly reliable data discrimination circuit.

As mentioned above, the Viterbi decoder can reduce data discrimination errors and realize highly reliable signal reproducing. However, the Viterbi decoder of the prior art uses a detection formula of Vth<X(n)–X(n–p) and X(n)–X(np)<0 or –Vth>X(n)–X(n–p) and X(n)–X(n–p)>0, so that the Viterbi decoder operates X(n)–X(n–p), compares the operation result with the reference value, detects the comparison result, and updates X(n–p). The processing of operation, comparison, and updating includes an operation for X(n) which is the current input, so that it is necessary to complete the processing before the next sampled data is inputted, that is, within one cycle of operation clock. When the operation clock frequency is low, this operational limitation is not questionable because the circuit processing time is shorter than one cycle of operation clock. However, when the operation clock frequency is high, the circuit operation time is longer than the operation clock cycle and the processing cannot be completed within one cycle of operation clock. Therefore, it is difficult to realize a high speed operation by the conventional Viterbi decoder.

SUMMARY OF THE INVENTION

An object of the present invention is to provide a Viterbi decoding art which allows a high speed operation compared with the conventional one.

Another object of the present invention is to provide a Viterbi decoding art which can increase the data decoding speed by increasing the sampling frequency for input data without improving the request performance for the components of the circuit unnecessarily.

Still another object of the present invention is to realize high speed transfer processing for reproduced data in the data recording/reproducing art using the Viterbi decoding art in the reproducing system.

To accomplish the above objects, the present invention provides a Viterbi decoding art using a detection art which can perform parallel operations unlike the detection formula of the conventional Viterbi decoder.

Therefore, the present invention is a Viterbi decoder for reproducing data from a reproduced signal and method therefor, which executes first detection for detecting that the reproduced signal value X(n) at the first sampling time is smaller than the reproduced signal value X(n−p) at the previous second sampling time and the value X(n) is larger than the value obtained by subtracting the detected amplitude Vth which is decided by the target amplitude of the reproduced signal from the value X(n−p), second detection for detecting that the value X(n) is larger than the value X(n−p) and the value obtained by adding the value Vth to the value X(n−p) is larger than the value X(n), and Viterbi decoding of the reproduced signal on the basis of at least one of the detected results by the first and second detections.

More concretely, assuming that the reproduced signal value at the sampling time of 'n' is X(n), and the reproduced signal value at the sampling time of 'n−p' is X(n−p), and the reference value is Vth, the detection formula of the Viterbi decoder is set as shown below.

When the detected polarity is negative:

$$X(n-p)-Vth<X(n)<X(n-p) \quad \text{Formula 1}$$

When the detected polarity is positive:

$$X(n-p)<X(n)<X(n-p)+Vth \quad \text{Formula 2}$$

Concretely, so as to execute all the processing, as an example, the following means are installed. A first storage means for storing X(n−p)−Vth when the detected polarity is negative and X(n−p) when the detected polarity is positive and a second storage means for storing X(n−p) when the detected polarity is negative and X(n−p)+Vth when the detected polarity is positive are installed. A first amplitude comparison means for outputting true when the reproduced signal value X(n) is larger than the value which is stored in the first storage means and a second amplitude comparison means for outputting true when the reproduced signal value X(n) is smaller than the value which is stored in the second storage means are installed. A detected polarity detection means for changing the detected polarity from negative to positive when the first amplitude comparison means is false and the second amplitude comparison means is true and changing the detected polarity from positive to negative when the first amplitude comparison means is true and the second amplitude comparison means is false is installed. An updating means for updating the first and second storage means depending on the detected polarity which is indicated by the detected polarity detection means when the first and second amplitude comparison means are false is installed.

A Viterbi decoder which can realize the objects of the present invention can be constituted using a detection formula other than the above.

Namely, assuming that the reproduced signal value at the sampling time of 'n' is X(n), and the reproduced signal Value at the sampling time of 'n−p' is X(n−p), and the reference value is Vth, the detection formula of the Viterbi decoder can be set as shown below.

When the detected polarity is negative:

$$X(n)<X(n-p)-Vth, X(n-p)<X(n) \quad \text{Formula 3}$$

When the detected polarity is positive:

$$X(n)<X(n-p), X(n-p)+Vth<X(n) \quad \text{Formula 4}$$

To realize all the processing, a third storage means for storing X(n−p)−Vth when the detected polarity is negative and X(n−p) when the detected polarity is positive and a fourth storage means for storing X(n−p) when the detected polarity is negative and X(n−p)+Vth when the detected polarity is positive are installed. A third amplitude comparison means for outputting true when the reproduced signal value X(n) is smaller than the value which is stored in the third storage means and a fourth amplitude comparison means for outputting true when the reproduced signal value X(n) is larger than the value which is stored in the fourth storage means are installed. A detected polarity detection means for changing the detected polarity from negative to positive when the third amplitude comparison means is true and the fourth amplitude comparison means is false and changing the detected polarity from positive to negative when the third amplitude comparison means is false and the fourth amplitude comparison means is true is installed. An updating means for updating the third and fourth storage means depending on the detected polarity which is indicated by the detected polarity detection means when the third or fourth amplitude comparison means is true is installed.

By doing this, the present invention can execute the function and operation indicated below.

The detection formula of the Viterbi decoder of the present invention is indicated by X(n−p)−Vth<X(n)<X(n−p) or X(n−p)<X(n)<X(n−p)+Vth depending on the detected polarity. The reference value Vth is a predetermined value, so that the decoder operates X(n−p)−Vth beforehand so as to update the peak and keeps the operation result. The detection formula of the Viterbi decoder is divided into the processing of operation, comparison, and updating. Therefore, all the processing which is conventionally executed in serial can be executed in parallel and the processing can be speeded by the operation time compared with the conventional.

Each means is operated in correspondence with them. The first storage means stores X(n−p)−Vth or X(n−p) which is the left side of the detection formula and the second storage means stores the numerical value after operation when the peak is updated for X(n−p) or X(n−p)+Vth which is the right side of the detection formula. The first amplitude comparison means compares the numerical value stored in the first storage means with the sampled data X(n) and the second amplitude comparison means compares the numerical value stored in the second storage means with the sampled data X(n). The detected polarity detection means indicates the polarity of a reproduced signal when detected and decides the operation expression when the peak is updated. Furthermore, the updating means operates the first and second storage means at the same time and updates the numerical values of the storage means when both the first and second amplitude comparison means are false. By installing the aforementioned means, the detection formula of the Viterbi decoder can be divided into the processing of operation, comparison, and updating and the Viterbi decoder can be speeded up.

The condition of the detection formula (Formula 3 or 4) of the Viterbi decoder of the latter invention is an inverted condition of the detection formula (Formula 1 or 2) of the former invention. Therefore, a high speed operation can be realized for the Viterbi decoder of the latter invention in the same way as with that of the former invention.

The foregoing and other objects, advantages, manner of operation and novel features of the present invention will be understood from the following detailed description when read in connection with the accompanying drawings.

BRIEF DESCRIPTION OF THE DRAWINGS

FIG. 3 is an illustration showing an example of the operation thereof.

DETAILED DESCRIPTION OF THE PREFERRED EMBODIMENTS

The embodiments of the present invention will be explained in detail hereunder with reference to the accompanying drawings.

EMBODIMENT 1

Figure 1:
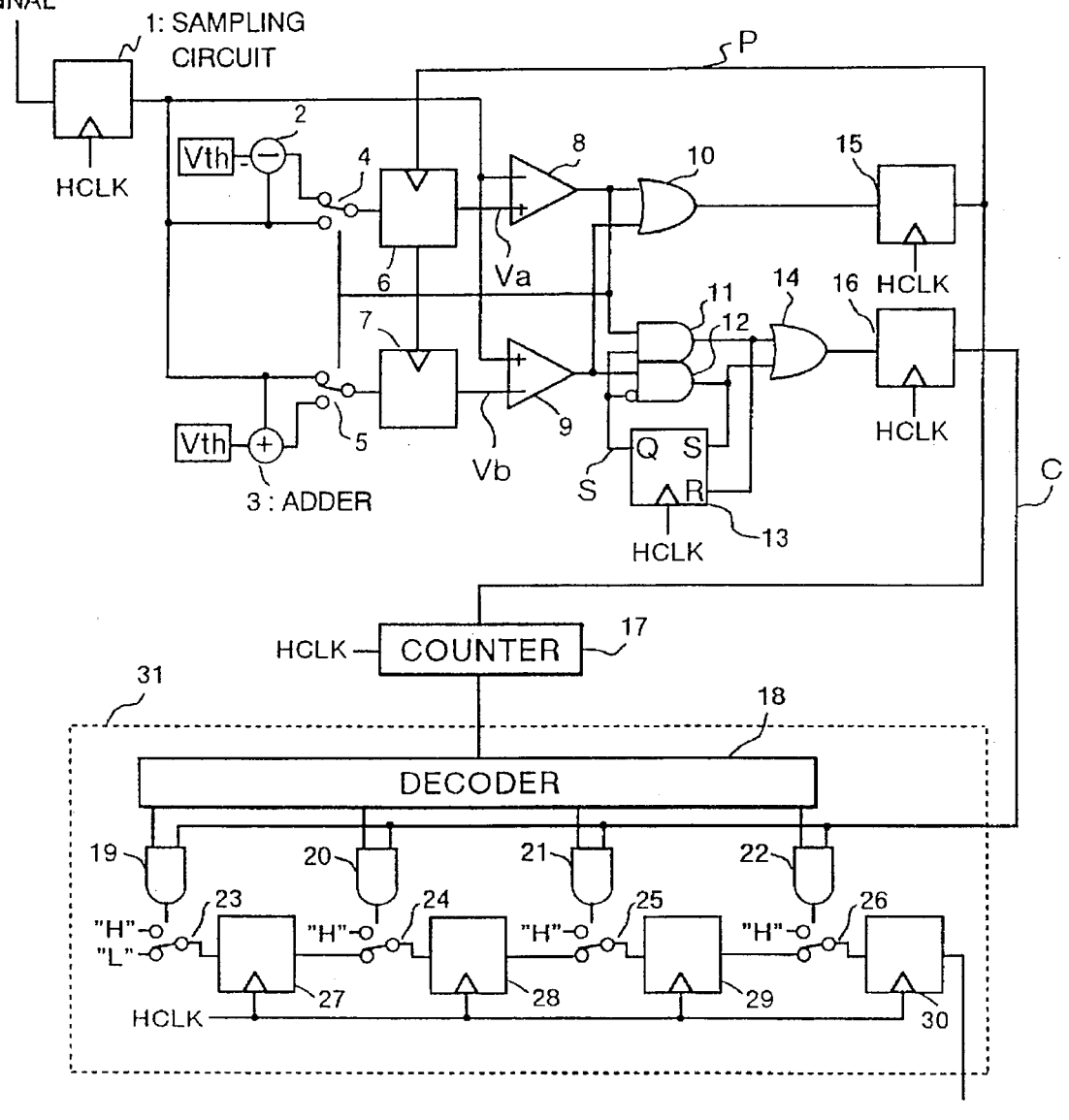
FIG. 1 is a conceptual diagram showing an example of the constitution of a Viterbi decoder which is an embodiment of the present invention.

FIG. 1 is a conceptual diagram showing an example of the constitution of a Viterbi decoder which is an embodiment of the present invention.

In FIG. 1, numeral 1 indicates a sampling circuit, 2 a subtracter, 3 an adder, 4 and 5 selectors, 6 and 7 latches, 8 and 9 comparators, 10 and 14 OR circuits (OR), 11 and 12 AND circuits (AND), 13 a reset-set flip-flop (RS-FF), 15 and 16 delay type flip-flops (DFF), 17 a counter, 18 a decoder, 19 to 22 AND circuits (AND), 23 to 26 selectors, 27 to 30 delay type flip-flops (DFF), and 31 a shift register.

Figure 2:
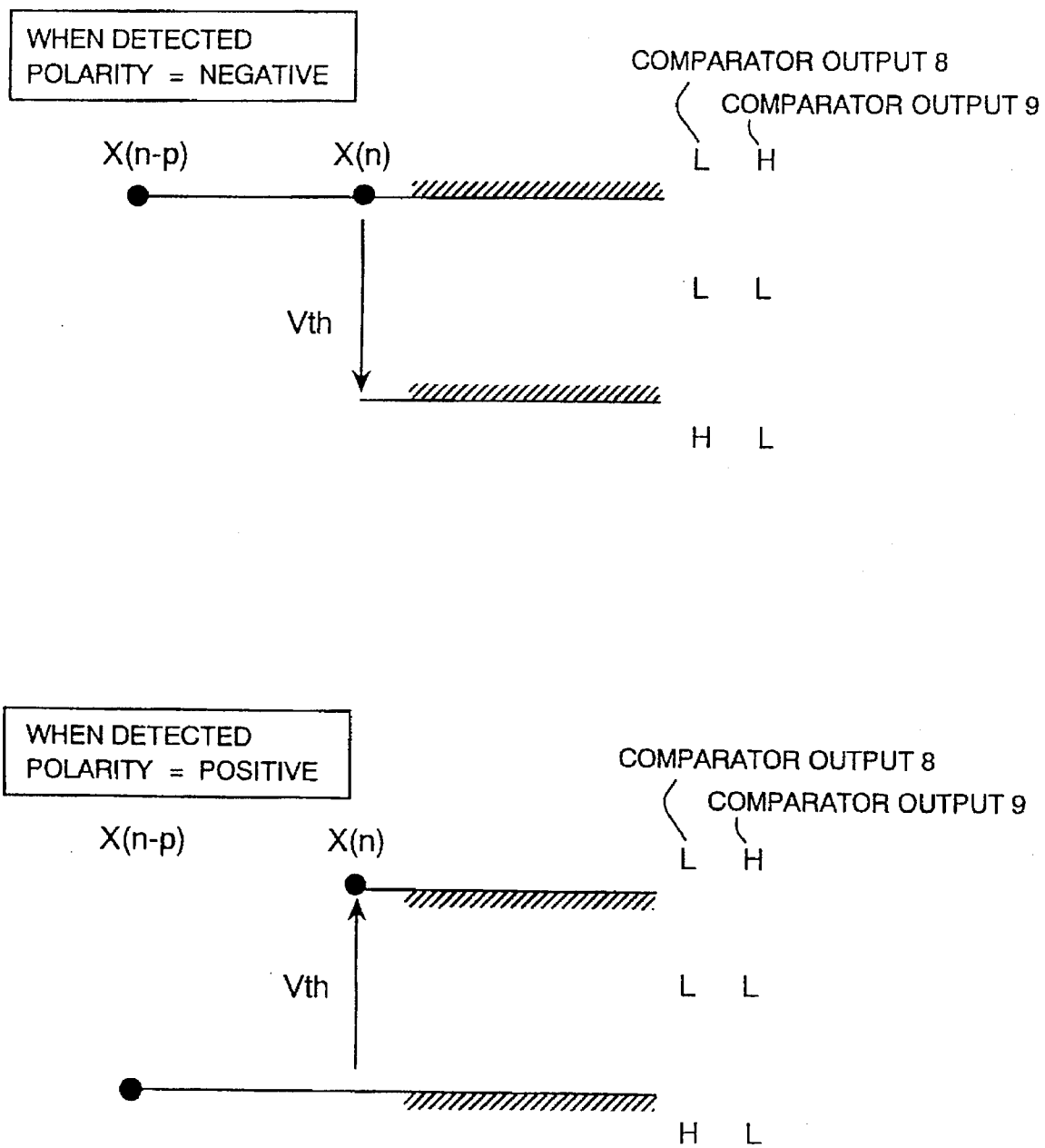
FIG. 2 is an illustration showing an example of the operation of the Viterbi decoder in the embodiment shown in FIG. 1.

The sampling circuit 1 converts a reproduced signal obtained from a magnetic recording medium to sampled data X(n) which is discrete time data whenever the sampling clock HCLK is triggered. Hereafter, the Viterbi decoder executes decoding operations when the sampling clock HCLK is triggered. The comparator 8 compares the sampled data X(n) and the numerical value stored in the latch 6 (the stored numerical value is taken as Va). When X(n)<Va, the comparator 8 outputs 'High' and when X(n)≧Va, the comparator 8 outputs 'Low'. The comparator 9 compares the sampled data X(n) and the numerical value stored in the latch 7 (the stored numerical value is taken as Vb). When X(n)>Vb, the comparator 9 outputs 'High' and when X(n)≦Vb, the comparator 9 outputs 'Low'. When the output of one of the comparators 8 and 9 is 'High', the OR 10 makes the input of the DFF 15 'High' and makes the peak value updating signal P 'High' via the DFF 15 when the sampling clock HCLK is triggered. When this condition is compared with the detection formula, the peak value updating signal P goes 'High' when Vb<X(n)<Va. On the other hand, the RS-FF 13 outputs a detected polarity selection signal S indicating the polarity of a reproduced signal to be detected. When the detected polarity selection signal S is 'High', it indicates that the negative polarity side of the reproduced signal is detected. When the detected polarity selection signal S is 'Low', it indicates that the positive polarity side of the reproduced signal is detected. Concretely, the correspondence between the detected polarity and the output of each comparator is as shown in FIG. 2 and the outputs of the comparators 8 and 9 will not be 'High' at the same time. The AND 11 and AND 12 decide a detected polarity selection signal S at the next time from the comparison result of the comparators 8 and 9 and the current detected polarity selection signal S. The latch 6 stores the numerical value of the sampled data X(n–p) or X(n–p)–Vth when the peak value updating signal P is 'High'. Selection signals of the selectors 4 and 5 are as shown in the truth table in FIG. 3. This truth table shows that the selection signals are outputs of the comparator 8. Therefore, the numerical value to be stored is decided by the output of the comparator 8. The selector 4 selects the numerical value of X(n–p)–Vth which is operated by the subtracter 2 when the comparator 8 is 'Low' or the value X(n–p) when the comparator 8 is 'High' and stores it in the latch 6. The latch 7 also stores the sampled data X(n–p) or X(n–p)+Vth when the peak value updating signal P is 'High' and selects X(n–p) when the comparator 8 is 'Low' or the numerical value of X(n–p)+Vth which is operated by the adder 3 when the comparator 8 is 'High' by the selector 5 and stores it in the latch 7.

On the basis of the aforementioned detection signals, a reproduced signal is decoded by the OR 14, DFF 16, counter 17, and shift register 31. The counter 17 counts up by one whenever the sampling clock HCLK is triggered when the peak value updating signal P is 'Low' and resets the count to '0' when the peak value updating signal P is 'High'. The OR 14 generates a detected polarity inversion signal C which goes 'High' when the detected polarity selection signal S is changed and outputs it to the shift register 31 via the DFF 16 after the sampling clock HCLK is inputted. The detected polarity inversion signal C is generated as shown in the truth table in FIG. 3. When the detected polarity inversion signal C is 'High', the bit at the position which is assigned by the numerical value of the counter 17 among the DFF 27 to DFF 30 of the shift register 31 is set to 'High'. The bit setting method is that the position of the numerical value given by the counter 17 which is set by the decoder 18 is discriminated, and only one of signals for connecting the decoder 18 and AND 19 to AND 22 is set to 'High' (the others are set to 'Low'), and the detected polarity inversion signal C is outputted to the selectors 23 to 26. In this case, it is assumed that when the output of the counter is '0', the AND 19 is selected, and when the output is '1', the AND 20 is selected, and when the output is '2', the AND 21 is selected, and when the output is '3', the AND 22 is selected. For example, assuming that the output of the counter is '2', the decoder 18 sets the signal connected to the AND 21 to 'High' (the others are set to 'Low') and outputs the detected polarity inversion signal C to the selector 25. The selector whose selection signal is only one among those of the selectors 23 to 26 which is set to 'High' (the selector 25 in the aforementioned example) sets the input of the DFF to 'High' (the DFF 29 in the aforementioned example). By repeating the above processing, the data decoded by the Viterbi decoder is outputted from the final bit (DFF 30) of the shift register 31.

Figure 4:
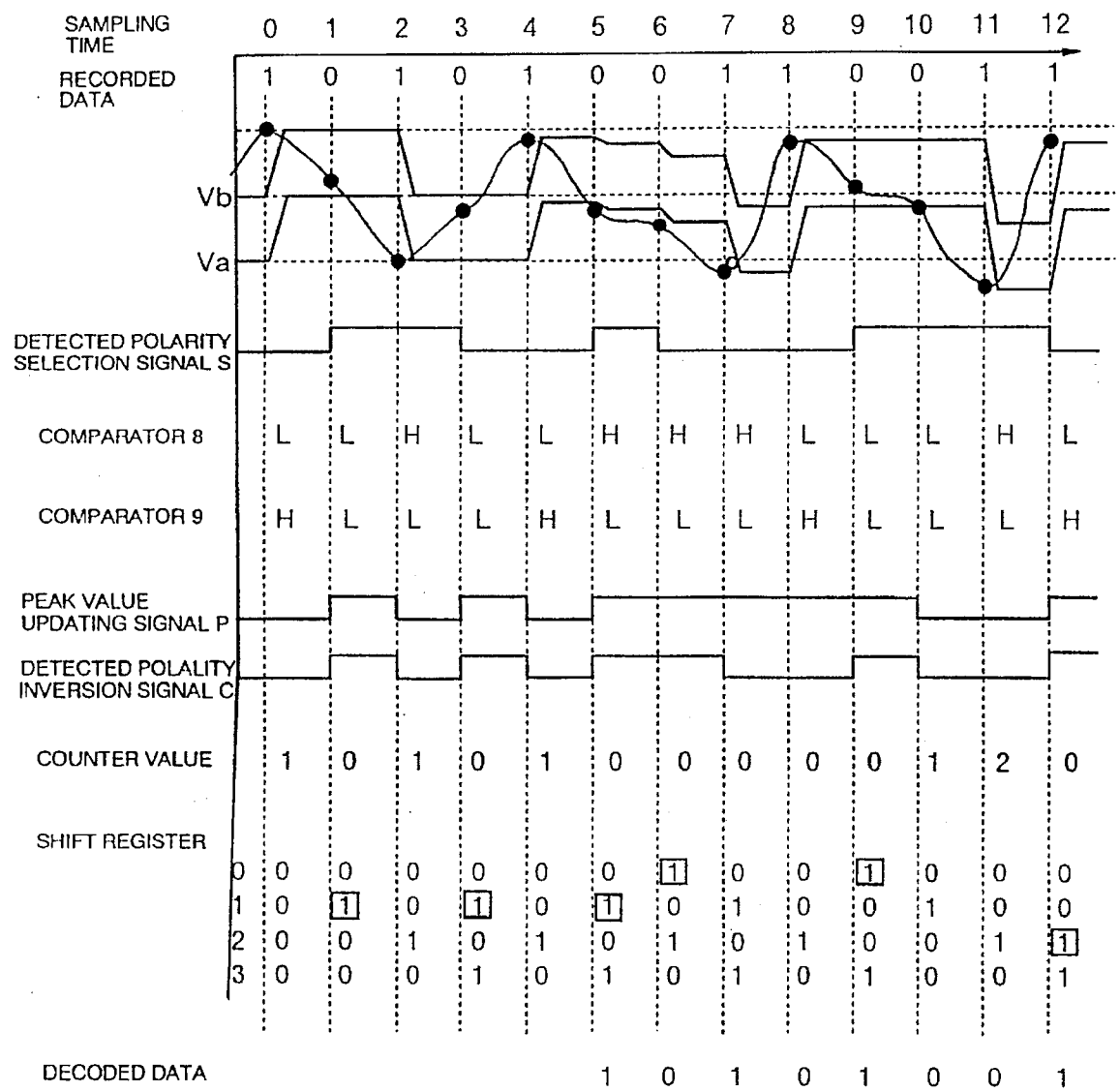
FIG. 4 is an illustration showing an example of the operation thereof.

The aforementioned operation of the Viterbi decoder at each time will be described in detail on the assumption that a reproduced signal as shown in FIG. 4 is inputted. For reason of explanation, it is assumed that the detected polarity selection signal S in the initial state is 'Low', and the numerical value Va which is stored in the latch 6 is −Vth, and the numerical value Vb which is stored in the latch 7 is 0.

Sampling time 0) X(0)<0: The detected value is updated. At Sampling time 1, a peak value updating signal P and a detected polarity inversion signal C are generated.

Sampling time 1) X(1)>X(0)−Vth: No detected value is updated.

Sampling time 2) X(2)<X(0)−Vth: The detected value is updated. At Sampling time 3, a peak value updating signal P and a detected polarity inversion signal C are generated.

Sampling time 3) X(3)<X(2)+Vth: No detected value is updated.

Sampling time 4) X(4)>X(2)+Vth: The detected value is updated. At Sampling time 5, a peak value updating signal P and a detected polarity inversion signal C are generated.

Sampling time 5) X(5)<X(4)−Vth: The detected value is updated. At Sampling time 6, a peak value updating signal P and a detected polarity inversion signal C are generated.

Sampling time 6) X(6)<X(5): The detected value is updated. At Sampling time 7, a peak value updating signal P is generated.

Sampling time 7) X(7)<X(6): The detected value is updated. At Sampling time 8, a peak value updating signal P is generated.

Sampling time 8) X(8)>X(7)+Vth: The detected value is updated. At Sampling time 9, a peak value updating signal P and a detected polarity inversion signal C are generated.

Sampling time 9) X(9)>X(8)−Vth: No detected value is updated.

Sampling time 10) X(10)>X(8)−Vth: No detected value is updated.

Sampling time 11) X(11)<X(8)−Vth: The detected value is updated. At Sampling time 12, a peak value updating signal P is generated.

At each sampling time, the counter value and shift register value are changed by the peak value updating signal P and the detected polarity inversion signal C as shown in FIG. 4. For example, at Sampling time 1, since the detected polarity inversion signal C is 'High', Bit 1 (DFF 28) of the shift register 31 which is indicated by the counter value of '1' is set to 'High'. Each counter value shown in FIG. 4 is expressed by the result controlled at each time, so that in this example, the counter value at Sampling time 0 indicates the bit which is set at Sampling time 1. When the above processing is continued, the set data reaches Bit 3 and is outputted as decoded data. (In this example, the decoded data is outputted after the sampling clock 5 clocks for the recorded data.)

As mentioned above, according to the Viterbi decoder in this embodiment, the processing of the subtracter 2, the adder 3, and others which perform subtraction and addition for the sampled data X(n) does not intervene in the processing loops of comparison and updating for peak value updating by the latches 6 and 7, the OR 10, the DFF 15, and others and in the detected polarity inversion detection processing, so that a high-speed operation is possible.

Figure 5:
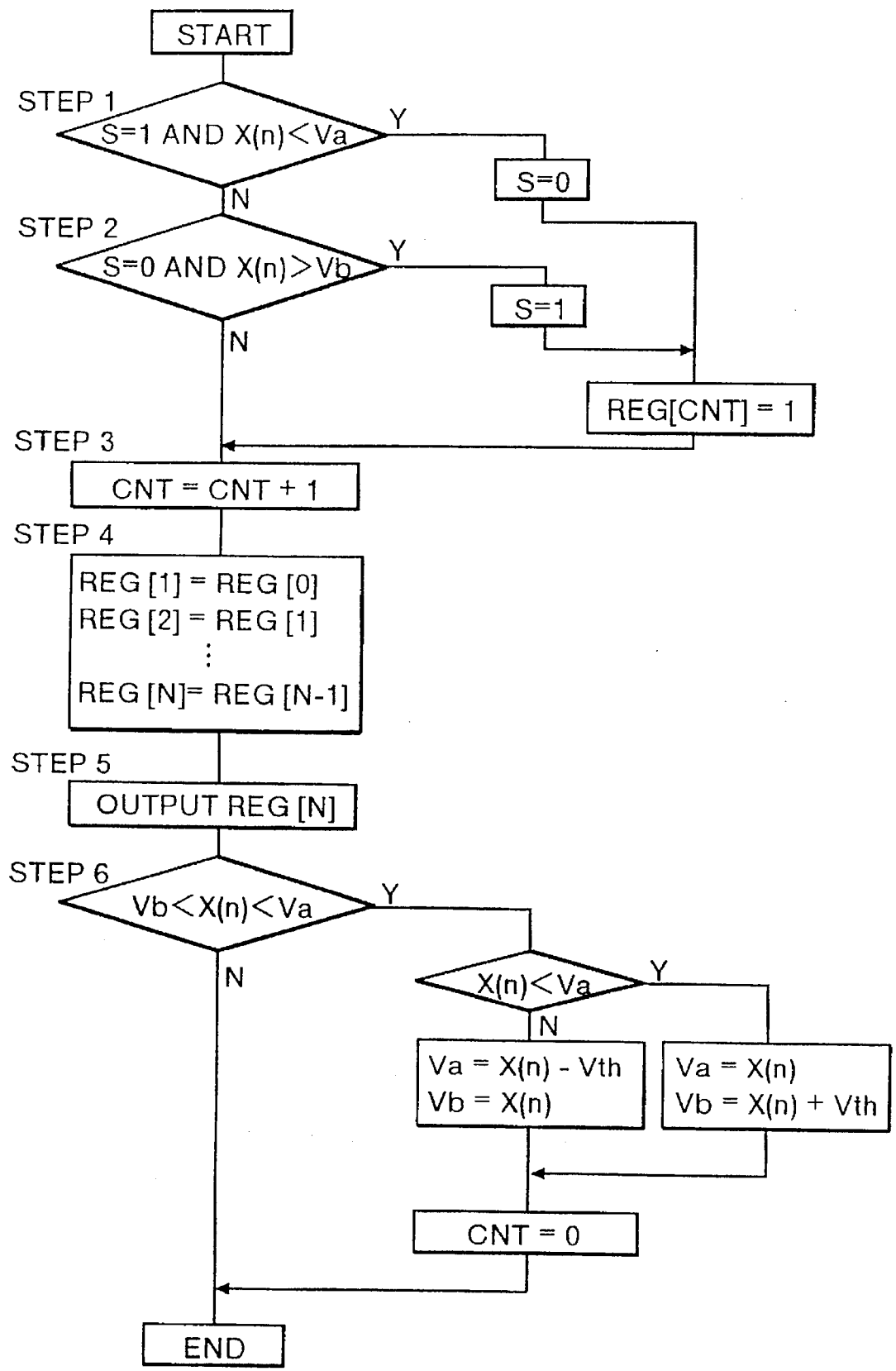
FIG. 5 is a flow chart showing the operation of the present invention.

The aforementioned circuit operation can be realized also by the method shown in FIG. 5. In FIG. 5, a symbol S indicates a detected polarity selection condition, REG 'n' arrays, and CNT a variable for selecting an array.

Step 1, when the detected polarity selection condition S is 1, and the input signal X(n) is smaller than Va, the detected polarity selection condition S is set to 0.

Step 2, when the detected polarity selection condition S is 0, and the input signal X(n) is larger than Vb, the detected polarity selection condition S is set to 1.

When the conditions are satisfied at Steps 1 and 2, the element of the array REG indicated by CNT is set to 1.

At Step 3, 1 is added to the variable CNT. At Step 4, the element of the array REG is replaced with the neighboring element.

At Step 5, the final element of the array REG is outputted as a detection result.

At Step 6, the input signal X(n) and Va and Vb are compared in amplitude. When the condition of Vb<X(n)<Va is satisfied, the following processing is executed.

When the input signal X(n) is smaller than Va, Va is replaced with the input signal X(n) and Vb is replaced with the sum of the input signal X(n) and reference value Vth. In other cases, Va is replaced with the difference obtained by subtracting the reference value Vth from the input signal X(n) and Vb is replaced with the input signal X(n).

Thereafter, the variable CNT is set to 0 and the array selection position is returned to 0.

When the above processing is executed every clock input, the processing of Va and Vb and the comparison processing of the input signal X(n) and Va can be executed separately from each other. As a result, the operation and comparison are processed in parallel and the processing can be speeded up.

In other words, data can be decoded at the target sampling frequency without the operation performance of the components of the circuit being improved unnecessarily and easy designing and lowering the cost of a Viterbi decoder can be realized.

EMBODIMENT 2

Figure 6:
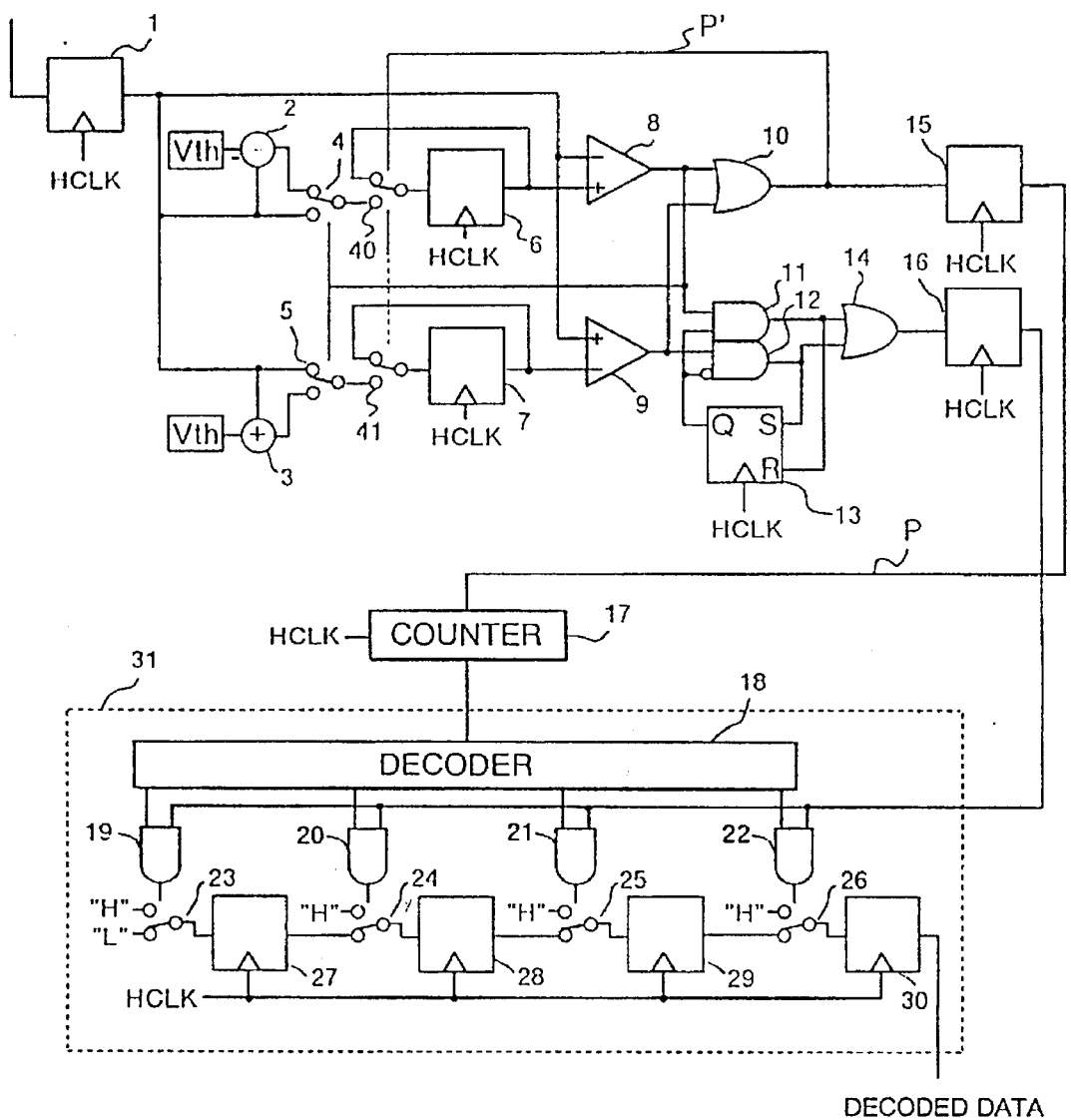
FIG. 6 is a conceptual diagram showing an example of the constitution of a Viterbi decoder which is another embodiment of the present invention.

Next, another embodiment of the present invention will be shown and the operation thereof will be explained. FIG. 6 is a conceptual diagram showing an example of the constitution of a Viterbi decoder which is another embodiment of the present invention.

In FIG. 6, numerals 40 and 41 indicate selectors and the same numbers are assigned to the others which are the same as those shown in Embodiment 1 mentioned above. The constitution is almost equal to that shown in FIG. 1 except that the selectors 40 and 41 are installed. The sampling circuit 1 samples a reproduced signal and outputs sampled data to the comparators 8 and 9. In this case, the numerical values stored in the storage circuits 6 and 7 are the same as those shown in FIG. 1 and the numerical value stored in the storage circuit 6 is the numerical value X(n−p)−Vth which is operated by the subtracter 2 or the sampled data X(n), which is decided by the selection result of the selector 4. In the embodiment shown in FIG. 1, the peak value updating signal P is directly inputted to the clock terminal of the storage circuit 6. However, in this embodiment, the sampling clock HCLK is inputted to the clock terminal of the storage circuit 6, and the selection signal of the shift register 31 is controlled by the peak value updating signal P, and the output of the selector 4 is outputted to the storage circuit 6 when the peak value updating signal P" is 'High' or the output of the storage circuit 6 is outputted to the storage circuit 6 when the peak value updating signal is 'Low'. Therefore, when the peak value updating signal P is 'Low', the numerical value of the storage circuit 6 is held and when the peak value updating signal P" is 'High', the output of the selector 4 is stored. Also the storage circuit 7 holds the storage circuit 7 and stores the output of the selector 4 by a peak value updating signal P". The other constitution operates in the same way as with that shown in FIG. 1, so that the explanation will be omitted.

This embodiment mentioned above operates in the same way as that shown in FIG. 1. However, since the DFF 15 does not take part in the control for comparison and updating, this embodiment can operate at a higher speed than the embodiment shown in FIG. 1.

EMBODIMENT 3

Figure 7:
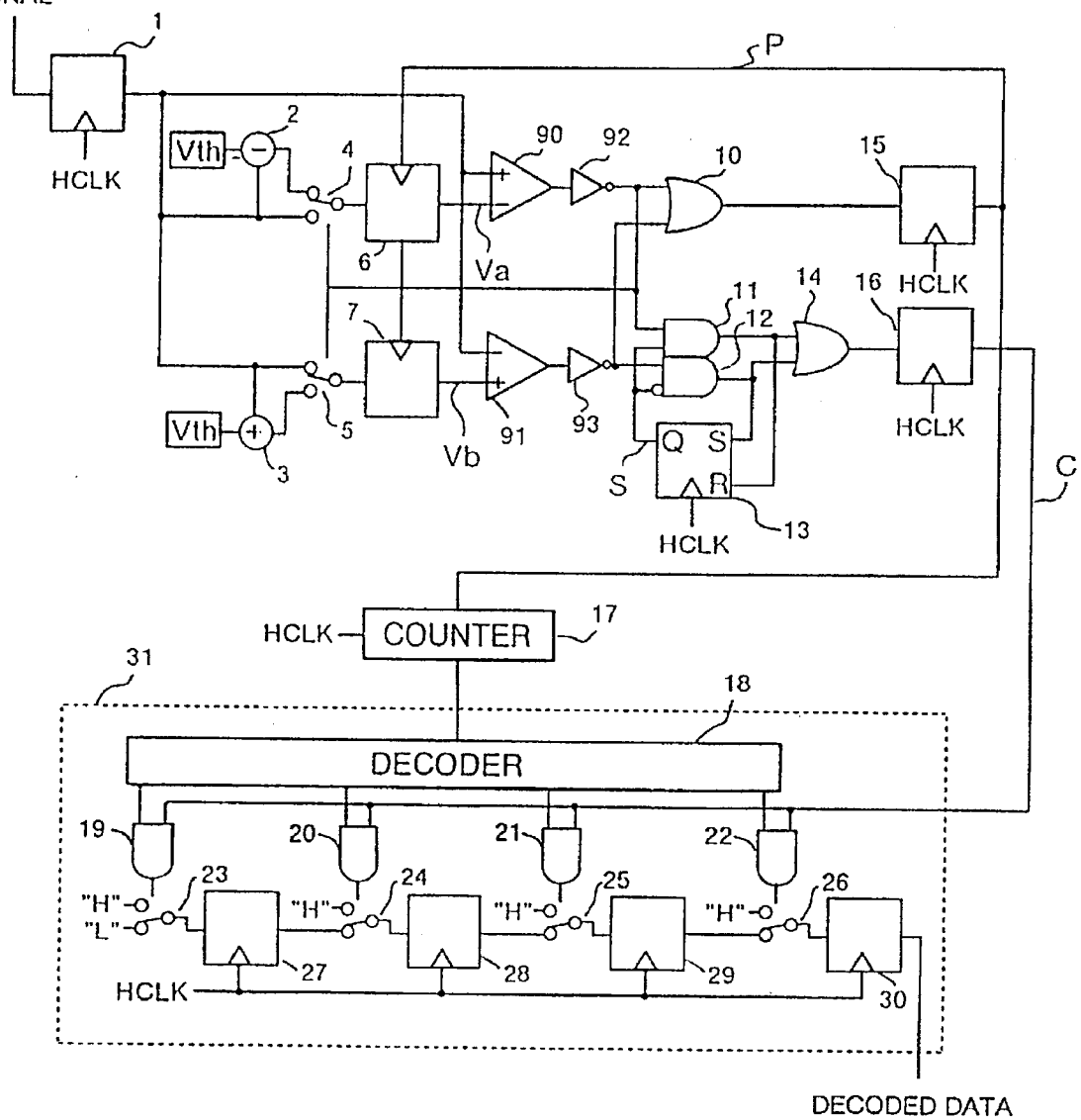
FIG. 7 is a conceptual diagram showing an example of the constitution of a Viterbi decoder which is still another embodiment of the present invention.

FIG. 7 is a conceptual diagram showing an example of the constitution of a Viterbi decoder which is still another embodiment of the present invention. This embodiment shows that even when the amplitude comparison condition is changed, the Viterbi decoder of the present invention can be constituted in the same way.

In FIG. 7, numerals 90 and 91 indicate inversion circuits and the same numbers are assigned to the others which are the same as those shown in FIG. 1. The comparator 90 compares the output Va of the register 6 and the sampled data X(n) in amplitude. When X(n)≧Va, the comparator 90 outputs 'High'. The comparator 91 compares the output Vb of the register 7 and the sampled data X(n) in amplitude. When X(n)≦Vb, the comparator 91 outputs 'High'. The inversion circuits 92 and 93 invert the digital levels of the comparators 90 and 91. When the inputs of the inversion circuits are 'High', they output 'Low'. When the inputs of the inversion circuits are 'Low', they output 'High'. The output of the inversion circuit 92 is the output of the comparator 90 which is inverted, that is, a signal which becomes 'High' when the amplitude comparison result is X(n)<Va. The output of the inversion circuit 93 is the output of the comparator 91 which is inverted, that is, a signal which becomes 'High' when the amplitude comparison result is X(n)>Vb.

When the constitution of this embodiment mentioned above is compared with the constitution of Embodiment 1 shown in FIG. 1, it can be easily understood that the comparators 8 and 9 are replaced with the comparators 90 and 91 and the inversion circuits 92 and 93 respectively. Therefore, this embodiment changes the amplitude comparison condition of Embodiment 1 mentioned above and operates in the same way as the aforementioned embodiment.

EMBODIMENT 4

Figure 8:
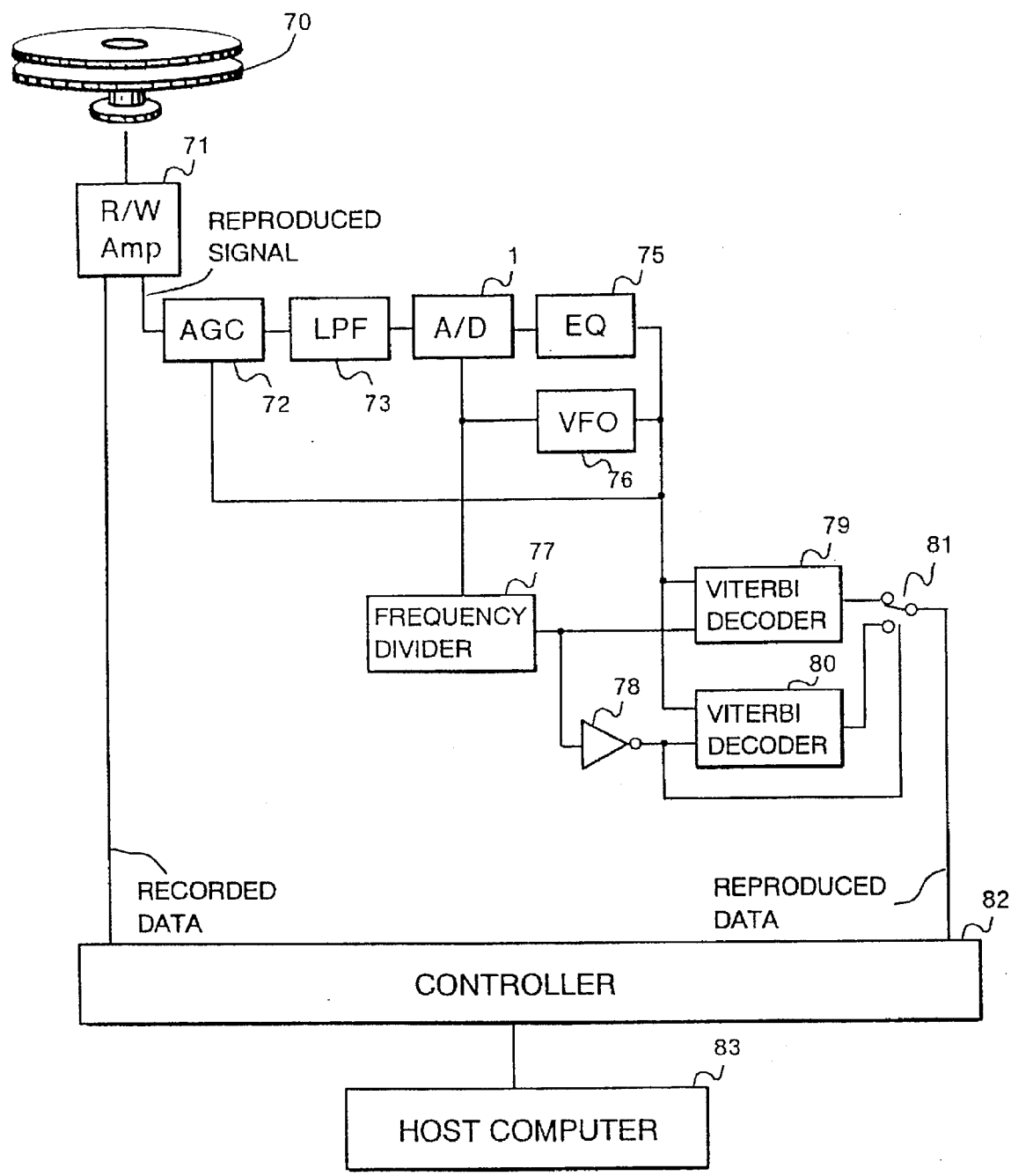
FIG. 8 is a conceptual diagram showing an example of the constitution of a data recording/reproducing apparatus which is an embodiment of the present invention.
Figure 9:
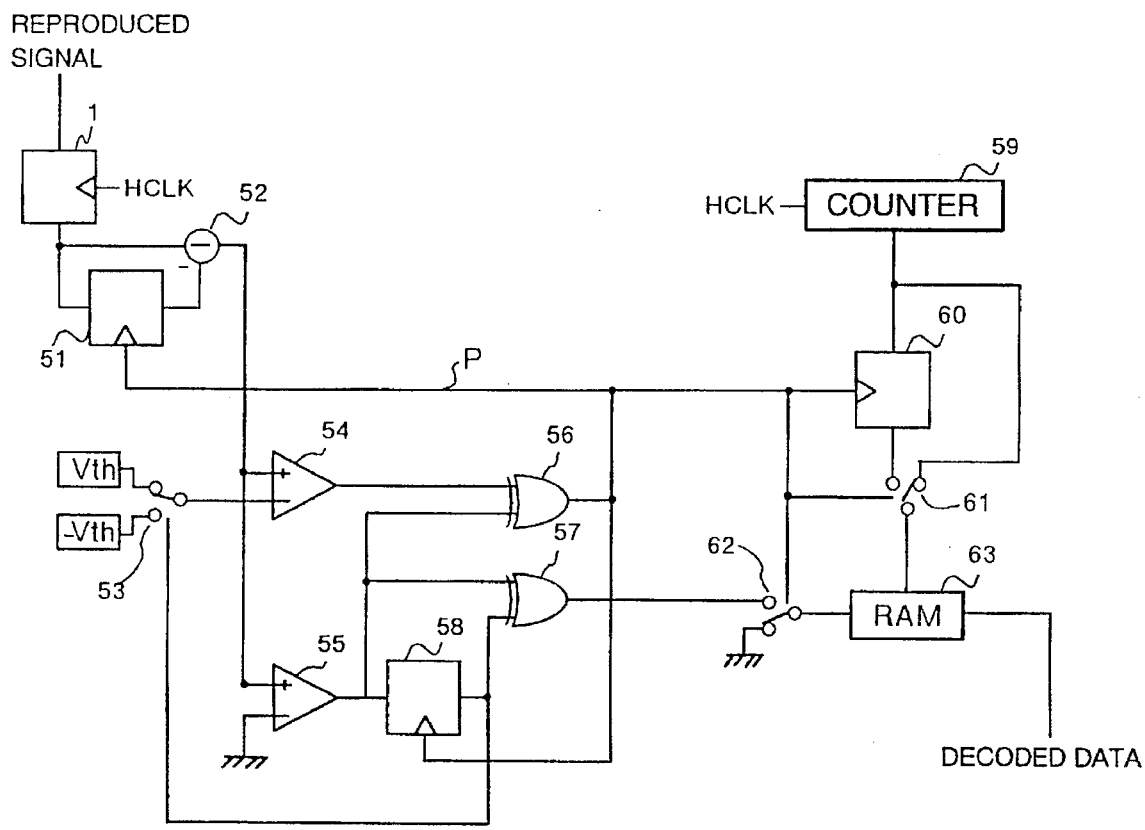
FIG. 9 is a conceptual diagram showing an example of the constitution of the conventional Viterbi decoder.
Figure 10:
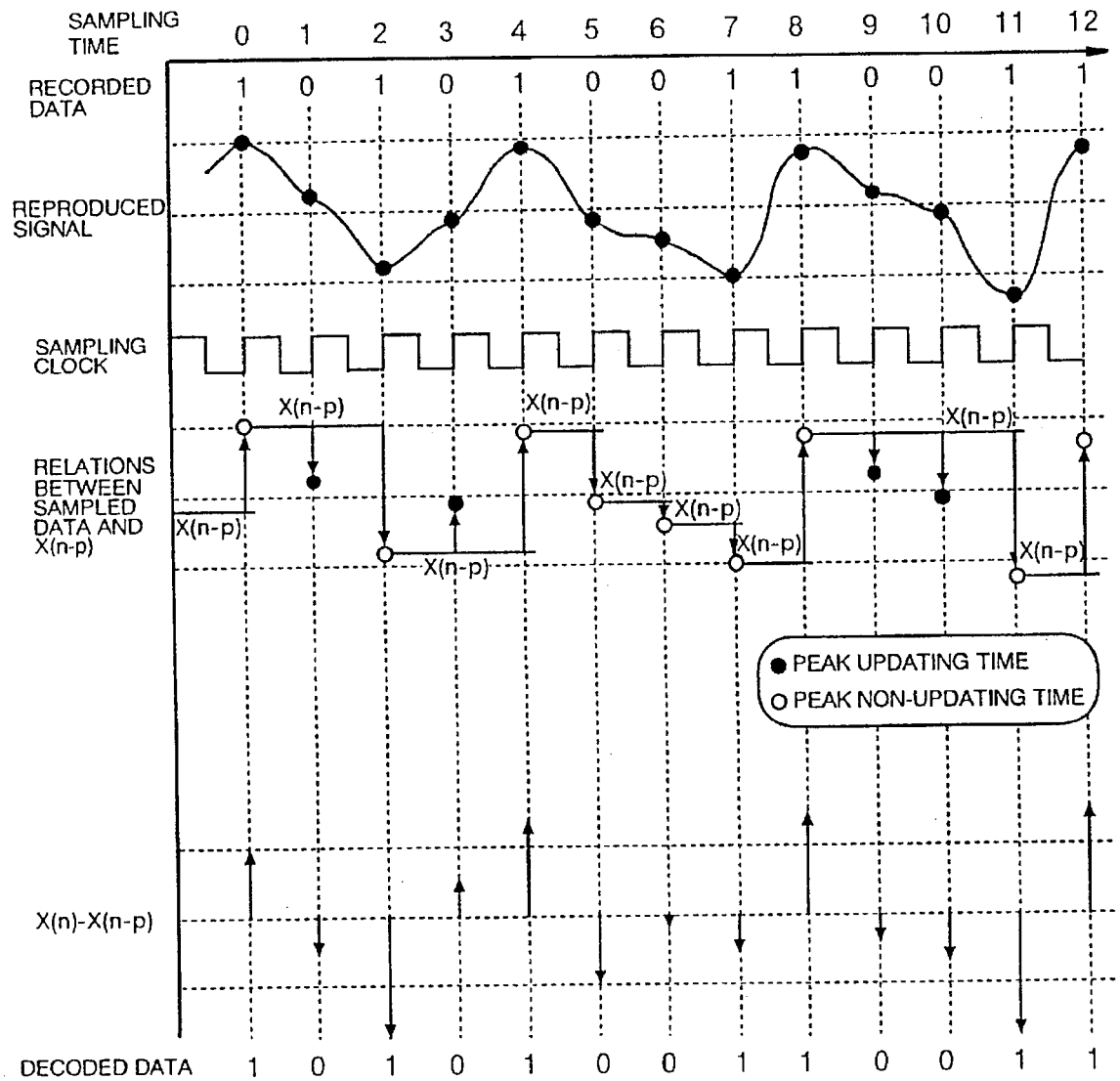
FIG. 10 is an illustration showing an example of the operation of the conventional Viterbi decoder.

FIG. 8 is a conceptual diagram showing an example of the constitution of a data recording/reproducing apparatus using the Viterbi decoder of the present invention.

In FIG. 8, numeral 70 indicates a recording medium, 71 a recording/reproducing amplifier, 72 an automatic gain control circuit (AGC), 73 a low pass filter (LPF), 75 an equalizer (EQ), 76 a variable frequency oscillator (VFO), 77 a frequency divider, 78 an inversion circuit, 79 and 80 Viterbi decoders of the present invention which are illustrated in Embodiments 1 to 3 mentioned above, 81 a selector, 82 a controller, and 83 a host computer. The operations thereof will be explained hereunder. When the host computer 83 records data, it combines the recording number and data via the interface and sends them to the controller 82. The controller 82 calculates the recording region of the recording medium 70 from the recording number, adds the check data to the data, and codes and generates recorded data. The recorded data is stored on the recording medium 70 via the recording/reproducing amplifier 71 for the recording region of the recording medium 70.

On the other hand, when data which is recorded by the host computer 83 is to be reproduced, the host computer 83 sends the reproducing number and a data reproducing request to the controller 82 via the interface. The controller 82 calculates the region in which the data is recorded from the reproducing number and performs a reproducing operation from the recording medium 70. The reproduced signal is inputted to the AGC 72 via the recording/reproducing amplifier 71. The AGC 72 absorbs an amplitude variation of the reproduced signal and operates so as to keep the signal amplitude constant. The LPF 73 removes unnecessary noise in the signal band and inputs the reproduced signal to the sampling circuit 1. The sampling circuit 1 samples the reproduced signal and shapes the signal waveform by the equalizer 75. The VFO 76 generates a sampling clock from the output of the EQ 75. The frequency divider 77 divides the sampling clock into a half frequency and generates an operation clock of the Viterbi decoder 79. The operation clock of the Viterbi decoder 80 has an opposite phase of that of the operation clock of the Viterbi decoder 79 and is generated by the inversion circuit 78. Therefore, the Viterbi decoder 79 reproduces signals of even samples of reproduced signals and the Viterbi decoder 80 reproduces signals of odd samples. The decoders connect the obtained reproduced data of the even and odd samples in series by the selector 81 again and output them to the controller 82. The controller 82 decides whether there is a decoding error from the check data for recording which is included in the reproduced data. When there is no error, the reproduced data is sent to the host computer 83 via the interface.

In the data recording/reproducing apparatus in this embodiment, the reliability of data reproducing by the Viterbi decoder and the data transfer speed to the host computer 83 can be improved.

For example, when data is recorded on the recording medium 70 in high density by using the partial response system, a highly reliable signal reproducing system can be realized. In this case, by performing the precoding processing when the recorded data is written into the recording medium 70, an error in data reproducing can be prevented more effectively.

EFFECTS OF THE INVENTION

In the Viterbi decoder of the present invention, an effect that a high-speed operation can be performed compared with the conventional Viterbi decoder can be obtained. For example, compared with the conventional circuit constitution, the operation speed can be increased by about 30%. Furthermore, an effect that the data decoding speed can be increased by increasing the sampling frequency for input data without improving the request performance for the components of the circuit unnecessarily can be obtained.

In the data recording/reproducing apparatus of the present invention, when the Viterbi decoding art is used in the reproducing system, an effect that high-speed transfer of reproduced data can be realized can be obtained.

What is claimed is:

1. A Viterbi decoder for reproducing data from a reproduced signal, comprising:

first detection means for detecting that a reproduced signal value X(n) at one sampling time is smaller than a reproduced signal value X(n–p) at a previous sampling time and said value X(n) is larger than a value obtained by subtracting a threshold amplitude Vth which is decided by a target amplitude of said reproduced signal from said value X(n–p), and providing a first output indicative thereof;

second detection means for detecting that said value X(n) at the one sampling time is larger than said value X(n–p) at the previous sampling time and a value obtained by adding said value Vth to said value X(n–p) is larger than said value X(n), and providing a second output indicative thereof; and means for executing Viterbi decoding for said reproduced signal on the basis of at least one of the first and second outputs by said first and second detection means.

2. A Viterbi decoder for reproducing data from a reproduced signal, comprising:

first detection means for detecting X(n–p)–Vth<X(n)<X(n–p) using a reproduced signal X(n) at a first sampling time, a reproduced signal X(n–p) at a second sampling time which is prior to said first sampling time, and a threshold amplitude Vth decided by a target amplitude of said reproduced signal, and providing detected results thereof;

second detection means for detecting X(n–p)<X(n)<X(n–p)+Vth and providing detected results thereof;

means for updating said value X(n–p) to a value decided by said value of X(n) on the basis of at least one of the detected results by said first and second detection means; and means for executing Viterbi decoding for the reproduced signal on the basis of at least one of the detected results by said first and second detection means.

3. A Viterbi decoder according to claim 2, further comprising:

means for deciding selection of said first detection means or said second detection means as detection means applied to a reproduced signal X(n+1) at a next sampling time by a peak value of said reproduced signal.

4. A Viterbi decoder for reproducing data from a reproduced signal, comprising:

first detection means for detecting X(n–p)–Vth>X(n)>X(n–p) using a reproduced signal X(n) at a first sampling time, a reproduced signal X(n–p) at a second sampling time which is prior to said first sampling time, and a threshold amplitude Vth decided by a target amplitude of said reproduced signal, and providing detected results thereof;

second detection means for detecting X(n–p)>X(n)>X(n–p)+Vth and providing detected results thereof;

means for updating said value X(n–p) to a value decided by said value of X(n) on the basis of at least one of the detected results by said first and second detection means; and means for executing Viterbi decoding for said reproduced signal on the basis of at least one of the detected results by said first and second detection means.

5. A Viterbi decoder according to claim 4, further comprising:

means for deciding selection of said first or second detection means as detection means applied to a reproduced signal X(n+1) at a next sampling time by a peak value of the reproduced signal.

6. A Viterbi decoder according to claim 2, further comprising:

means for storing at least one of said values X(n–p), X(n–p)+Vth, and X(n–p)–Vth prior to detection by said first and second detection means.

7. A Viterbi decoder for reproducing data from a reproduced signal, comprising at least one combination constitution of:

a first combination constitution comprising, first amplitude comparison means which becomes true when at least one of the detection formulas X(n)>X(n–p)–Vth and X(n)>X(n–p) is held using a reproduced signal X(n) at a first sampling time, a reproduced signal X(n–p) at a second sampling time prior to said first sampling time, and a threshold amplitude Vth decided by a target amplitude of said reproduced signal, second amplitude comparison means which becomes true when at least one of the detection formulas X(n)<X(n–p) and X(n)<X(n–p)+Vth is held, first updating means for updating X(n–p) to X(n) when said first and second amplitude comparison means are false at the same time, and selection means for selecting a detection formula applied to a third reproducing signal X(n+1) after said first sampling time when comparison results of said first and second amplitude comparison means conform to the detection formula X(n)<X(n–p)–Vth or X(n)>X(n–p)+Vth; and a second combination constitution comprising, third amplitude comparison means which becomes true when at least one of the detection formulas X(n)<X(n–p)–Vth and X(n)<X(n–p) is held, fourth amplitude comparison means which becomes true when at least one of the detection formulas X(n)>X(n–p) and X(n)>X(n–p)+Vth is held, second updating means for updating X(n–p) to X(n) when said third or fourth amplitude comparison means is true, and selecting means for selecting a detection formula applied to a third reproducing signal X(n+1) after said first sampling time when comparison results of said third and fourth amplitude comparison means conform to the detection formula X(n)<X(n–p)–Vth or X(n)>X(n–p)+Vth.

8. A Viterbi decoder for reproducing data from a reproduced signal, comprising at least one combination constitution of:

a first combination constitution comprising, first storage means for storing X(n–p)–Vth or X(n–p) operated at a second sampling time or after said second sampling time using a reproduced signal X(n) at a first sampling time, a reproduced signal X(n–p) at said second sampling time prior to said first sampling time, and a threshold amplitude Vth decided by a target amplitude of said reproduced signal, second storage means for storing X(n–p) or X(n–p)+Vth which is operated at said second sampling time or after said second sampling time, first amplitude comparison means which becomes true when a reproduced signal X(n) at said first sampling time is larger than a value stored in said first storage means, second amplitude comparison means which becomes true when said reproduced signal X(n) is smaller than a value stored in said second storage means, and first updating means for updating a value of said first storage means to X(n) or X(n)–Vth and updating a value of said second storage means to X(n)+Vth or X(n) when comparison results of said first and second amplitude comparison means are false at the same time; and a second combination constitution comprising, third storage means for storing X(n–p)–Vth or X(n–p) operated at said second sampling time or after said second sampling time, fourth storage means for storing X(n–p) or X(n–p)+Vth operated at said second sampling time or after said second sampling time, third amplitude comparison means which becomes true when said reproduced signal X(n) is larger than a value stored in said third storage means, fourth amplitude comparison means which becomes true when said reproduced signal X(n) is smaller than a value stored in said fourth storage means, and second updating means for updating a value of said third storage means to X(n) or X(n)–Vth and updating a value of said fourth storage means to X(n)+Vth or X(n) when comparison result of said third or fourth amplitude comparison means is true.

9. A Viterbi decoder according to claim 7, further comprising:

calculation means for calculating a time difference between a sampling time at which said value X(n) is updated and a current sampling time; and a shift register for updating a bit at the position indicated by said calculation means.

10. A Viterbi decoder according to claim 8, further comprising:

calculation means for calculating a time difference between a sampling time at which said value X(n) is updated and a current sampling time; and a shift register for updating a bit at the position indicated by said calculation means.

11. A data recording/reproducing apparatus for recording and reproducing data, comprising:

a recording medium for recording data;

recording/reproducing means for recording said data on said recording medium and amplifying a reproduced signal;

clock reproducing means for reproducing a clock signal on the basis of a reproduced signal; and a Viterbi decoder including:

first detection means for detecting that said reproduced signal value X(n) at a first sampling time which is clocked by said clock reproducing means is smaller than said reproduced signal value X(n–p) at a previous second sampling time and said value X(n) is larger than a value obtained by subtracting a threshold amplitude Vth decided by a target amplitude of said reproduced signal from said value X(n–p), and providing detected results thereof;

second detection means for detecting that said value X(n) is larger than said value X(n–p) and a value obtained by adding said value Vth to said value X(n–p) is larger than said value X(n) and providing detected results thereof; and means for executing Viterbi decoding for said reproduced signal on the basis of at least one of the detected results by said first and second detection means.

12. A data recording/reproducing apparatus according to claim 11, further comprising:

signal amplitude stabilizing means for keeping an amplitude of said reproduced signal constant;

filtering means for removing unnecessary noise included in said reproduced signal;

sampling means for sampling said reproduced signal; and equalizing means for shaping a waveform of said reproduced signal.

13. A Viterbi decoding method for reproducing data from a reproduced signal, comprising:

detection step of detecting that a reproduced signal value X(n) at one sampling time is smaller than a reproduced signal value X(n–p) at a previous sampling time and said value X(n) is larger than a value obtained by subtracting a detected amplitude Vth which is decided by target amplitude of said reproduced signal from said value X(n–p), and providing a first output indicative thereof;

a second detection step of detecting that said value X(n) at the one sampling time is larger than said value X(n–p) at the previous sampling time and a value obtained by adding said value Vth to said value X(n–p) is larger than said value X(n), and providing a second output indicative thereof; and a step of executing Viterbi decoding for said reproduced signal on the basis of at least one of the first and second outputs by said first and second detection means.

14. A Viterbi decoding method for reproducing data from a reproduced signal, comprising:

a first detection step of detecting X(n–p)–Vth<X(n)<X(n–p) using a reproduced signal X(n) at a first sampling time, a reproduced signal X(n–p) at a second sampling time which is prior to said first sampling time, and a threshold amplitude Vth which is decided by a target amplitude of said reproduced signal, and providing detected results thereof;

a second detection step for detecting X(n–p)<X(n)<X(n–p)+Vth and providing detected results thereof;

a step of updating said value X(n–p) to the value X(n) on the basis of at least one of the detected results by said first and second detection steps; and a step of executing Viterbi decoding for said reproduced signal on the basis of at least one of the detected results by said first and second detection steps.

* * * * *